US006541362B2

(12) United States Patent
Forbes et al.

(10) Patent No.: US 6,541,362 B2
(45) Date of Patent: Apr. 1, 2003

(54) METHODS OF FORMING SEMICONDUCTOR STRUCTURES

(75) Inventors: Leonard Forbes, Corvallis, OR (US); Kie Y. Ahn, Chappaqua, NY (US); Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/062,892

(22) Filed: Jan. 30, 2002

(65) Prior Publication Data

US 2002/0098690 A1 Jul. 25, 2002

Related U.S. Application Data

(63) Continuation of application No. 09/478,975, filed on Jan. 6, 2000, now Pat. No. 6,372,618.

(51) Int. Cl.[7] ............................................. H01L 21/44
(52) U.S. Cl. ..................... 438/596; 438/592; 438/689; 438/721
(58) Field of Search ................................ 438/592, 596, 438/630, 631, 648, 649, 682, 689, 721

(56) References Cited

U.S. PATENT DOCUMENTS

| 4,113,551 | A | | 9/1978 | Bassous et al. ............ 146/662 |
| 4,285,761 | A | * | 8/1981 | Fatula et al. ............... 438/592 |
| 4,716,131 | A | | 12/1987 | Okazawa et al. |
| 4,954,867 | A | | 9/1990 | Hosaka ........................ 357/52 |
| 5,003,375 | A | | 3/1991 | Ichikawa |
| 5,160,987 | A | | 11/1992 | Pricer et al. ................. 257/307 |
| 5,256,585 | A | | 10/1993 | Bae |
| 5,518,966 | A | | 5/1996 | Woo |
| 5,736,455 | A | | 4/1998 | Iyer |
| 5,796,151 | A | | 8/1998 | Hsu et al. ..................... 257/410 |
| 5,804,499 | A | | 9/1998 | Dehm et al. ................ 438/592 |
| 5,872,057 | A | | 2/1999 | Lee ............................. 438/655 |
| 5,925,918 | A | | 7/1999 | Wu et al. |
| 5,981,993 | A | | 11/1999 | Cho |
| 5,998,290 | A | | 12/1999 | Wu et al. |
| 6,075,274 | A | | 6/2000 | Wu et al. |

OTHER PUBLICATIONS

Very Uniform and High Aspect Ratio Anisotropy SiO$_2$ Etching Process in Magnetic Neutral Loop Discharge Plasma; W. Chen et al. J. Vac. Sci. Technol. A 17(5) Sep./Oct. 1999.

Selective dry etching in a high density plasma for 0.5 μm complementary metal–oxide–semiconductor technology; J. Givens et. al., IBM Corporation; J. Vac. Sci. Technol. B 12(1), Jan./Feb. 1994.

(List continued on next page.)

Primary Examiner—Kamand Cuneo
Assistant Examiner—Lisa Kilday
(74) Attorney, Agent, or Firm—Wells St. John P.S.

(57) ABSTRACT

One aspect of the invention encompasses a method of forming a semiconductor structure. A patterned line is formed to comprise a first layer and a second layer. The first layer comprises silicon and the second layer comprises a metal. The line has at least one sidewall edge comprising a first-layer-defined portion and a second-layer-defined portion. A third layer is formed along the at least one sidewall edge. The third layer comprises silicon and is along both the first-layered-defined portion of the sidewall edge and the second-layered-defined portion of the sidewall edge. The silicon of the third layer is reacted with the metal of the second layer to form a silicide along the second-layer-defined portion of the sidewall edge. The silicon of the third layer is removed to leave the silicon of the first layer, the metal of the second layer, and the silicide.

24 Claims, 9 Drawing Sheets

OTHER PUBLICATIONS

Silicon Processing For the VLSI Era; vol. 1; Process Technology; Stanley Worlf Ph. D.; Richard N. Tauber Ph.D.>; Lattice PRess, Sunset Beach, California.

Highly Reliable Tungsten Gate Technology; N. Kobayashi et al., Central Research Laboratory, Hitachi Ltd.

Integration Technorology of Polymetal (W/WSiN/Poly–Si) Dual Gate CMOS for 1Gbit DRAMs and Beyond; ULSI Device Engineering Lab; 1998 IEEE IEDM 98–389.

In–situ Barrier Formation for High Reliable W/barrier/poly–Si Gate Using Denudation of Wnx on Polycrystalline Si; Byung Hak Lee, Dong Kyun Sohn, et al.; R & D Division, LG Semicon Co. Ltd., Korea, 1998, IEEE; IEDM 98–385.

An Ultra–Low Resistance and Thermally Stable W/pn–Poly–Si Gate CMOS Technology Using SI/TiN Buffer Layer; Hitoshi Wakabayashi et al.; Silicon Systems Research Labs, Japan; 1998 IEEE; IEDM 98–393.

Improving Gate Oxide Integrity (GOI) Of a W/WNx/dual–poly Si stacked–gate by using Wet–Hydrogen oxidation in 0.14–$\mu$m CMOS devices; Kazuhiro Ohnishi et al; Central Research Lab, Hitachi Ltd; Japan; 1998 IEEE; IEDM 98–397.

A Totally Wet Etch Fabrication Technology For Amorphous Silicon Thin Film Transistors; Amir Masoud Miri and Savvas G. Chamberlain; University of Waterloo, Canada; Mat. Res. Soc. Symp. Proc. vol. 377 1998 Materials Research Society.

* cited by examiner

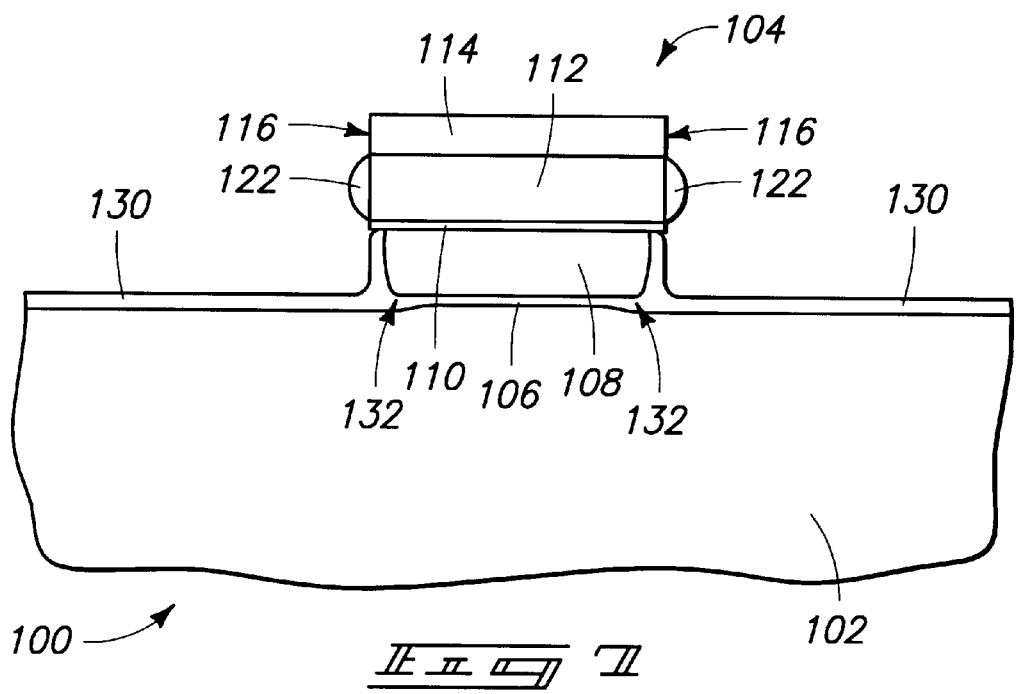
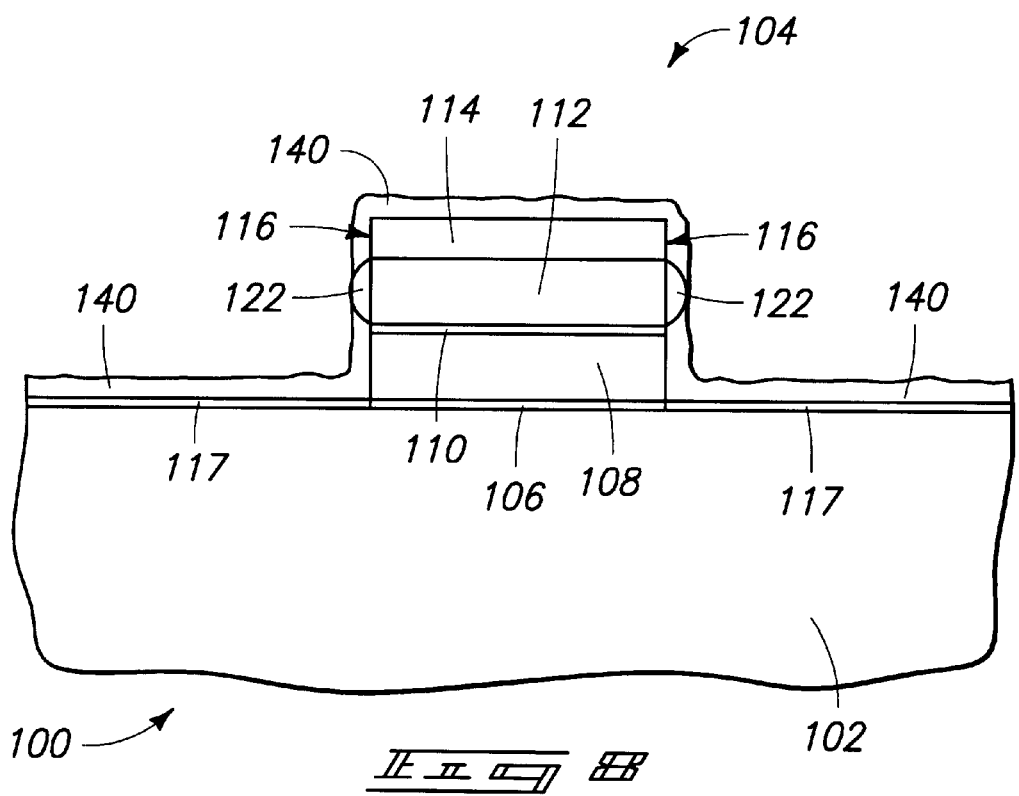

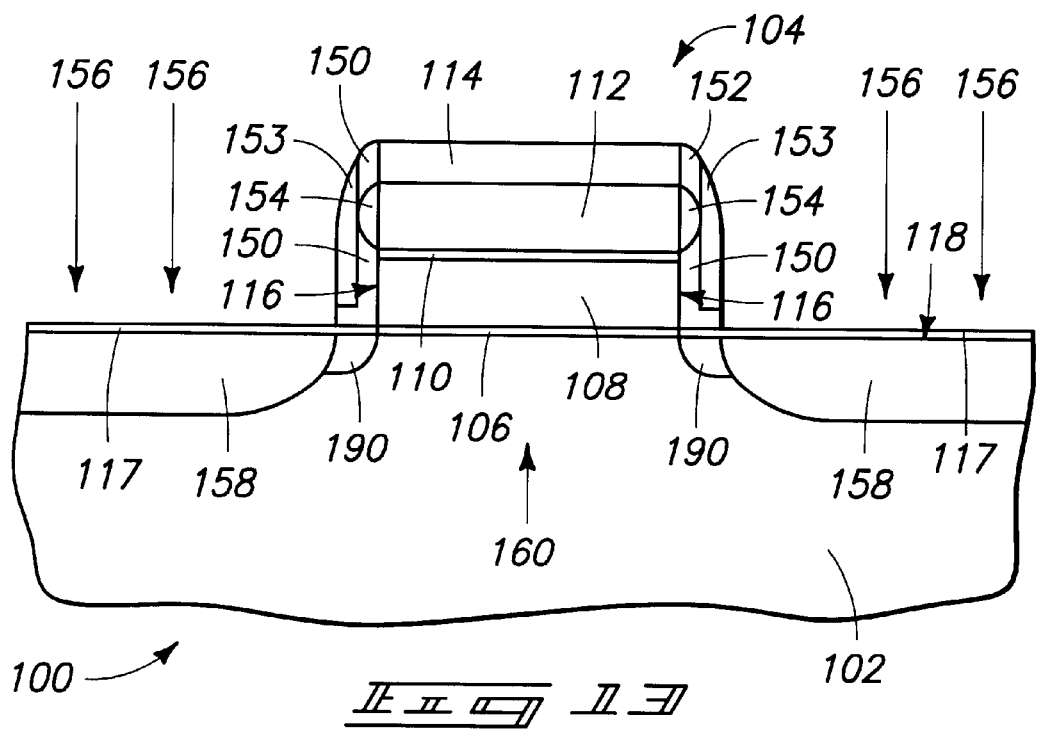
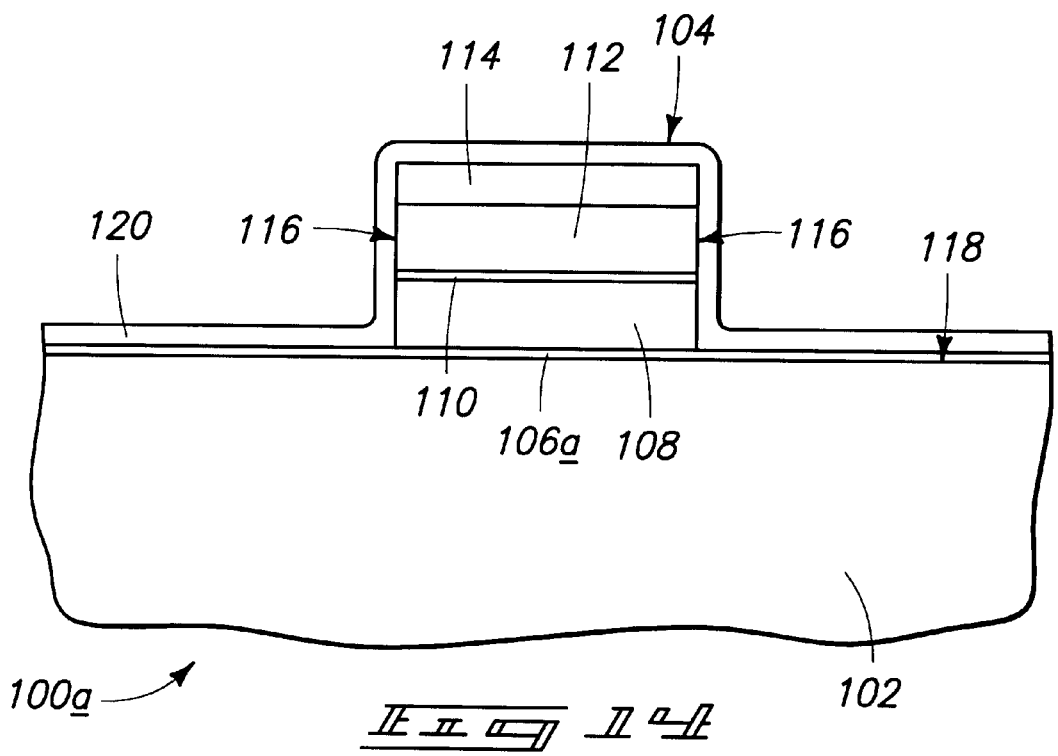

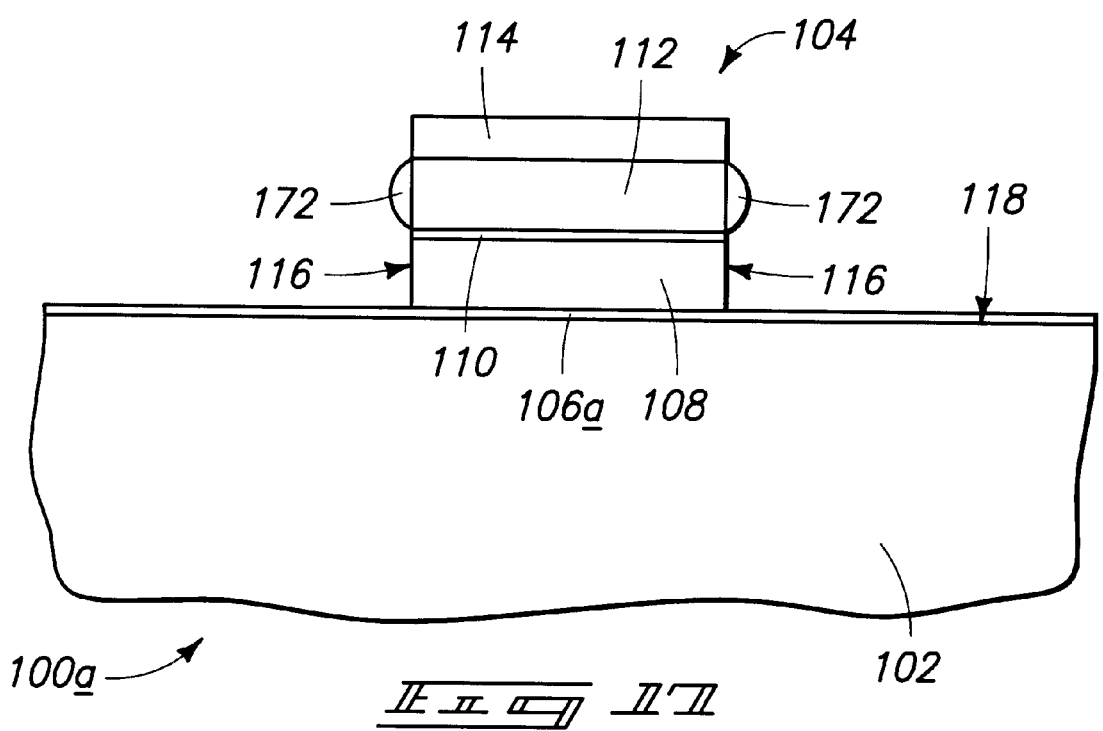

METHODS OF FORMING SEMICONDUCTOR STRUCTURES

CROSS REFERENCE TO RELATED APPLICATION

This application is a continuation of U.S. patent application Ser. No. 09/478,975, which was filed on Jan. 6, 2000 now U.S. Pat. No. 6,372,618 and which is incorporated by reference herein.

TECHNICAL FIELD

The invention pertains to methods of forming semiconductor structures, including methods of forming transistor gates for field effect transistor and flash memory devices.

BACKGROUND OF THE INVENTION

A continuing goal in semiconductor device fabrication is to create increasing densities of circuitry on semiconductor real estate. Such goal is realized through ever-decreasing dimensions of semiconductor circuit elements. For instance, in the early 1970's a typical gate length of a field effect transistor gate in a dynamic random access memory (DRAM) device was on the order of from 5 to 6 micrometers, and polysilicon was utilized as a sole conductive material of the gate. Advances in DRAM generation of the late 1980's reduced the gate length to approximately one micrometer. However, it was found that word line resistance was too high if conductively doped polysilicon was utilized as the sole conductive component of a gate line, and accordingly silicide (such as tungsten silicide, molybdenum silicide or titanium silicide) was deposited over the polysilicon. The term "polycide" was coined to describe a stack of gate materials which comprised conductively doped polysilicon having a silicide thereover.

Technological advances of the 1990's reduced the gate length to less than 0.2 micrometers. It was found that the resistance of polycide materials was too high for such gates, and accordingly procedures were developed to provide a metal to replace the silicide of the polycide structure. Exemplary metals utilized are tungsten, molybdenum and titanium. Such gates would be considered modern structures in current technology.

FIG. 1 shows a semiconductor wafer fragment 10 comprising a field effect transistor 12 having such a gate structure. More specifically, wafer fragment 10 comprises a substrate 14 having a gate structure 16 formed thereover. Gate structure 16 comprises a gate oxide layer 20 (which typically comprises silicon dioxide), a conductively-doped-semiconductive-material layer 22 (which can comprise silicon and germanium, and which typically comprises conductively doped polysilicon), a conductive diffusion barrier layer 24 (which typically comprises a metal nitride, such as, for example, $WN_x$, TiN), a metal layer 26 (which can comprise, for example, tungsten, molybdenum or titanium), and an insulative cap 28 (which can comprise, for example, silicon nitride or silicon dioxide).

Semiconductive substrate 14 can comprise, for example, conductively doped monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Gate structure 16 has opposing sidewalls 30, and insulative spacers 32 are formed along such opposing sidewalls. Insulative spacers 32 can comprise, for example, silicon nitride.

Source/drain regions 18 formed proximate gate structure 16, and a channel region 19 is defined beneath gate structure 16. Spacers 32 can be utilized during formation of source/drain regions 18 to space an implant of a conductivity-enhancing dopant from sidewall edges 30, and to thereby control a location of heavily doped source/drain regions 18 relative to sidewalls 30. Lightly doped diffusion regions are formed beneath sidewalls 32, and between heavily doped source/drain regions 18 and channel region 19, to define graded junction regions 33. The lightly doped diffusion regions are frequently formed prior to provision of sidewalls 32.

A problem can occur in utilizing the field effect transistor structure 12 of FIG. 1 in DRAM devices. DRAM devices normally operate with a wordline voltage in excess of power supply voltage (a so-called boosted wordline). Accordingly, transistor gates utilized in gated DRAM structures are exposed to larger electric fields than in other devices, and are more subject to breakdown and failure. Also, DRAM retention time depends on the storage node junction leakage, which in turn can be affected by the electric field at intersecting corners of the gate and the drain junction. The electric field between the gate and the drain junction often induces more junction leakage and is frequently referred to as Gate Induced Drain Leakage (GIDL). It is therefore desirable to have a thickened gate oxide region at the corner of the gate and the drain to reduce the electric field, and hence the leakage.

One of the techniques utilized to enhance integrity of transistor gates is to oxidize a portion of a semiconductive material substrate proximate the gate to form small "bird's beak" structures beneath sidewall edges 30. Such technique is illustrated in FIG. 2 wherein wafer fragment 10 is illustrated at a processing step subsequent to the formation of gate structure 16, but prior to formation of spacers 32 and source/drain regions 18. An upper surface of semiconductive material wafer 14 has been oxidized to form a silicon dioxide layer 34 which connects with gate oxide 20. Silicon dioxide layer 34 comprises small bird's beak regions 36 which extend beneath sidewalls 30. Silicon dioxide layer 34 also extends along a portion of sidewall 30 corresponding to the sidewall edges of semiconductive-material layer 22, as such edges are oxidized during the oxidation of the upper surface of semiconductive material 14.

A problem which occurs with the processing of FIG. 2 is that sidewall edges of metal layer 26 can be oxidized during the oxidation of semiconductive material 14. Oxidation of metal layer 26 forms metal oxide regions 38. The volume expansion associated with the formation of metal oxide regions 38 can cause lifting of the metal lines, which can result in failure of field effect transistor structures incorporating gate structure 16.

Among the techniques which have been utilized to avoid oxidation of the metal edge are wet hydrogen oxidation, and the utilization of silicon nitride or silicon dioxide to protect the edges. Additionally, silicon oxynitride has been utilized to cover edges of the metal material in the gate stack prior to oxidation of an upper surface of semiconductive material 14.

The above-described problems are not limited to field effect transistor technologies. The problems can also occur in stacks utilized for other memory devices, such as, for example, the gate stacks utilized in flash memory devices. FIG. 3 illustrates a semiconductor wafer fragment 50 comprising a semiconductive material substrate 52, and a flash memory device gate stack 54 formed over substrate 52. Substrate 52 can comprise, for example, monocrystalline silicon lightly doped with a p-type background dopant. Gate stack 54 comprises a gate oxide layer 56 (which can comprise silicon dioxide), a floating gate 58 (which comprises semiconductive material, which can comprise Si and Ge, and which typically comprises conductively doped polysilicon), an intergate dielectric layer 60 (which can comprise silicon dioxide), a conductively-doped-semiconductive-material layer 62 (which can comprise conductively doped polysilicon), a barrier layer 64 (which can comprise a metal nitride), a metal layer 66 (which can comprise tungsten, titanium or molybdenum), and an insulative cap 68 (which can comprise silicon nitride). FIG. 3 also shows an oxide layer 69 over substrate 52, and Lightly Doped Diffusion (LDD) regions 71 implanted beneath oxide layer 69 and proximate gate stack 54. LDD regions 71 can be formed by, for is example, implanting n-type conductivity enhancing dopant (such as phosphorus or arsenic) into substrate 52.

Note that layers 60, 62, 64, 66 and 68 comprise a stack identical to the stack utilized in gate structure 16. Accordingly, oxidation of semiconductive material substrate 52 can lead to problems similar to those discussed above regarding oxidation of semiconductive material 14. Specifically, oxidation of semiconductive material 52 can be accompanied by oxidation of sidewall edges of metal layer 66 which can cause failure of a circuit device incorporating stack 54.

The above-described FIGS. 1–3 illustrate cross-sectional views through the described stacks of conductive and insulative materials. Such cross-sectional views are utilized to illustrate various layers within the stacks. An alternative description of the stacks of FIGS. 1–3 is to refer to the stacks as portions of patterned wordlines. In such alternative description, it is to be understood that the stacks can be portions of lines extending across the respective semiconductor material substrates (i.e., the stacks can be patterned in the shape of lines). Source/drain regions will be provided at various intervals along the lines, and the lines will thus have transistor gate regions functioning as gating structures between respective pairs of source/drain regions.

It would be desirable to develop alternative methods of forming gate stacks and wordlines.

SUMMARY OF THE INVENTION

One aspect of the invention includes a method of forming a conductive line. A line stack is formed of at least two different conductive material layers. At least one of the layers comprises a metal, and the line stack has at least one sidewall edge that includes the metal-comprising layer. The metal-comprising layer is reacted at the sidewall edge with silicon to form the metal-comprising layer to comprise a silicide at the sidewall edge and unreacted metal inwardly thereof. After the reacting, at least a portion of the line stack is oxidized.

Another aspect of the invention encompasses a method of forming a semiconductor structure. A patterned line is formed to comprise a first layer and a second layer. The first layer comprises silicon and the second layer comprises a metal. The line has at least one sidewall edge comprising a first-layer-defined portion and a second-layer-defined portion. A third layer is formed along the at least one sidewall edge. The third layer comprises silicon and is along both the first-layered-defined portion of the sidewall edge and the second-layered-defined portion of the sidewall edge. The silicon of the third layer is reacted with the metal of the second layer to form a silicide along the second-layer-defined portion of the sidewall edge. The silicon of the third layer is removed to leave the silicon of the first layer, the metal of the second layer, and the silicide.

In another aspect, the invention encompasses another method of forming a semiconductor structure. A patterned line is formed to comprise a first layer and a second layer. The first layer comprises silicon and the second layer comprises a metal. The line has at least one sidewall edge comprising a first-layered-defined portion and a second-layered-defined portion. A third layer is formed along the at least one sidewall edge. The third layer comprises silicon and is along both the first-layer-defined portion of the sidewall edge and the second-layer-defined portion of the sidewall edge. The silicon of the third layer is reacted with metal of the second layer to form a silicide along the second-layer-defined portion of the sidewall edge. The silicon of the third layer is provided to be different than the silicon of the first layer, and is selectively removed relative to the silicon of the first layer to leave the silicide along the second-layer-defined portion of the sidewall edge.

BRIEF DESCRIPTION OF THE DRAWINGS

Preferred embodiments of the invention are described below with reference to the following accompanying drawings.

FIG. 7 is a view of the FIG. 4 wafer fragment illustrating the structure of FIG. 4 at a processing step subsequent to that of FIG. 6.

FIG. 8 is a view of the FIG. 4 wafer fragment illustrating the structure of FIG. 4 processed according to another method of the present invention, and shown at a processing step subsequent to that of FIG. 4.

FIG. 13 is a view of the FIG. 4 wafer fragment shown at a processing step subsequent to that of FIG. 12.

FIG. 14 is a fragmentary, diagrammatic, cross-sectional view of a semiconductor wafer fragment shown at a preliminary processing step of yet another method of the present invention.

FIG. 17 is a view of the FIG. 14 wafer fragment shown at a processing step subsequent to that of FIG. 16.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In particular aspects, the invention encompasses methods of protecting a metal layer during oxidation of a proximate substrate by forming silicide structures over regions of the metal layer. The silicide protects regions of the metal layer from being exposed to oxidizing conditions.

Figure 4:
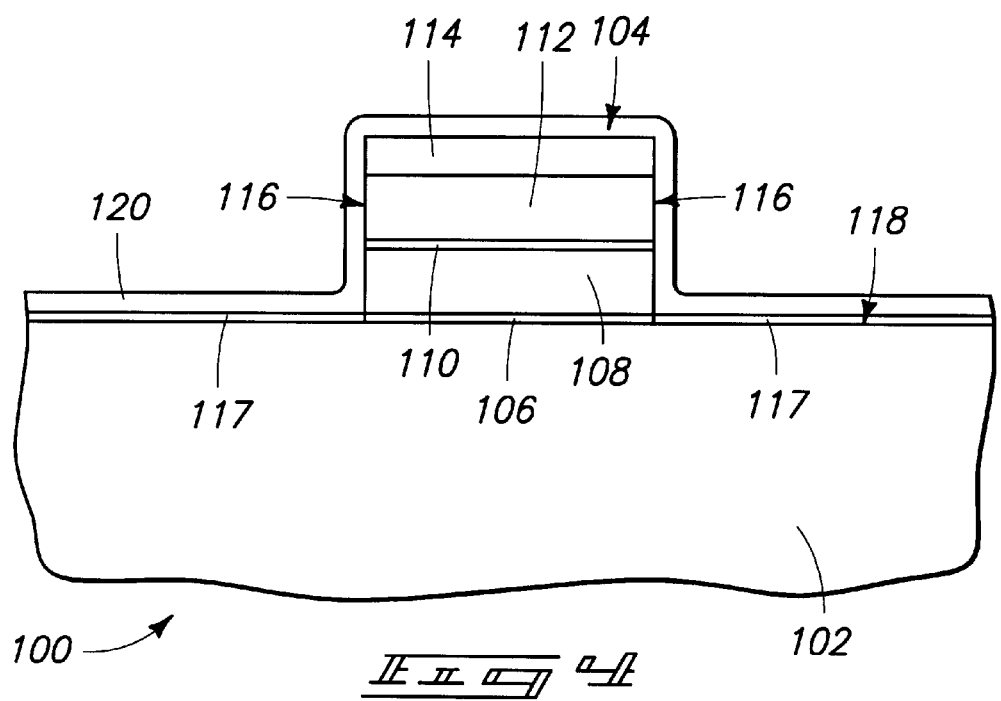
FIG. 4 is a diagrammatic, fragmentary, cross-sectional view of a semiconductor wafer fragment illustrating a gate structure at a preliminary step of a method of the present invention.

A first embodiment method of the present invention is described with reference to FIGS. 4–6. Referring initially to FIG. 4, such illustrates a semiconductor wafer fragment 100 comprising a semiconductive material substrate 102 having a gate stack 104 formed thereover. Semiconductive material substrate 102 can comprise, for example, monocrystalline silicon lightly doped with a p-type background dopant. Gate stack 104 comprises a gate dielectric layer 106 (which can comprise, for example, silicon dioxide), a semiconductive-material layer 108 (which can comprise silicon and germanium, and which typically comprises conductively doped polysilicon), a barrier layer 110 (which can comprise, for example, a metal nitride, such as titanium nitride or tungsten nitride), a metal layer 112 (which preferably comprises an elemental form of a metal, and which can comprise, for example, tungsten, titanium, cobalt or molybdenum), and an insulative cap 114 (which can comprise, for example, silicon nitride and/or silicon dioxide).

For purposes of interpreting this disclosure and the claims that follow, a layer which is referred to as a "silicon layer" is to be understood to comprise silicon and may consist essentially of silicon, but not necessarily to consist essentially of silicon unless it is expressly stated that such layer consists essentially of silicon. Accordingly, a "silicon layer" can comprise, for example, silicon and germanium. Additionally, a "metal layer" is to be understood to comprise metal and may consist essentially of metal, but not to necessarily consist essentially of metal unless it is specifically stated to consist essentially of metal.

Gate stack 104 comprises sidewalls 116, and such sidewalls comprise portions of each of layers 106, 108, 110, 112 and 114. In particular aspects of the invention, layer 108 can be referred to as a first layer and layer 112 as a second layer. The portion of sidewall 116 corresponding to layer 112 can thus be referred to as a second-layer-defined portion, and the portion of sidewall 116 corresponding to layer 108 can be referred to as a first-layer-defined portion.

Substrate 102 comprises an upper surface 118, some of which is covered by gate stack 104, and some of which extends beyond gate stack 104. An etch stop layer 117 is formed over upper surface 118 of substrate 102. Such etch stop layer can comprise, for example, silicon oxide or silicon nitride. A silicon layer 120 is formed over upper surface 118 of substrate 102 (and specifically on etch stop layer 117), along sidewalls 116 of gate stack 104, and over an upper surface of gate stack 104. Layer 120 can comprise, for example, silicon in amorphous or polycrystalline form, and is typically formed to a thickness of from about 100 angstroms to about 200 angstroms. Silicon layer 120 can be formed by chemical vapor deposition to provide layer 120 to lie conformally over the sidewalls and top of gate stack 104. Generally, the difference between whether layer 120 comprises amorphous silicon or polycrystalline silicon is determined by a temperature of deposition, with amorphous silicon being deposited at temperatures of from about 500° C. to about 550° C., and polycrystalline silicon being deposited at temperatures of from about 580° C. to about 625° C.

In particular aspects of the invention, silicon layer 120 comprises a different composition than silicon-containing layer 108. Such difference in composition can correspond to, for example, a difference in dopant concentration within silicon layer 120 relative to silicon layer 108. For instance, layer 108 preferably has a conductivity-enhancing impurity concentration of at least $1 \times 10^8$ atoms/cm$^3$ to render layer 108 electrically conductive. Accordingly, layer 120 can be provided with a conductivity-enhancing dopant concentration of less than $1 \times 10^8$ atoms/cm$^3$ to provide a difference between layers 120 and 108. Such difference can be exploited in later steps of the method to enable layer 120 to be selectively removed relative to layer 108. In particular embodiments, layer 120 can be provided to be substantially undoped with conductivity-enhancing impurity, with the term "substantially undoped" understood to mean a dopant concentration of less than or equal to about $1 \times 10^{15}$ atoms/cm$^3$. A "substantially undoped" silicon layer is different than an "undoped" silicon layer in that an "undoped" silicon layer would have a dopant concentration of about 0, whereas a "substantially undoped" silicon layer can have a dopant concentration from zero to as high as about $10^{15}$ atoms/cm$^3$.

In particular aspects of the invention, layer 120 can be referred to as a third layer which extends along both the portion of the sidewall 116 defined by silicon layer 108, and the portion defined by metal layer 112.

Figure 5:
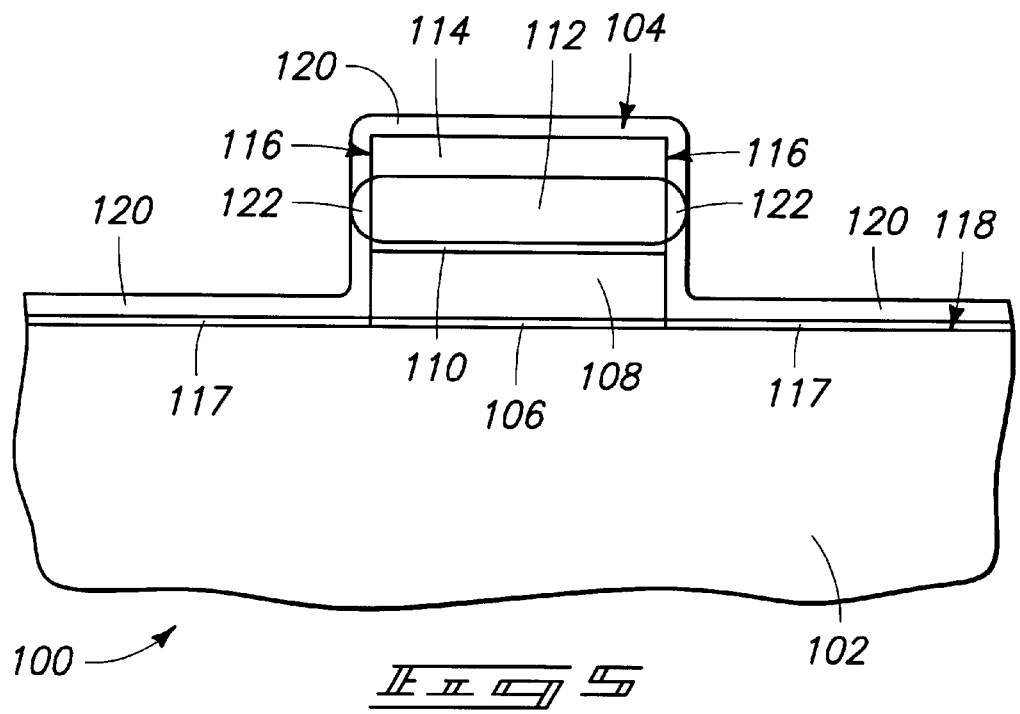
FIG. 5 is a view of the FIG. 4 wafer fragment illustrating the structure of FIG. 4 at a processing step subsequent of that of FIG. 4.

FIG. 5 shows fragment 100 after exposure to conditions which react silicon of layer 120 with metal of layer 112 to form silicide regions 122. Exemplary reaction conditions are to anneal fragment 100 at 900° C. for about 20 minutes in an inert atmosphere. Alternative reaction conditions comprise rapid thermal processing (RTP) for ten seconds to 950° C. The second reaction conditions can be preferred in order to avoid dopant redistribution between silicon layers 120 and 108.

Figure 6:
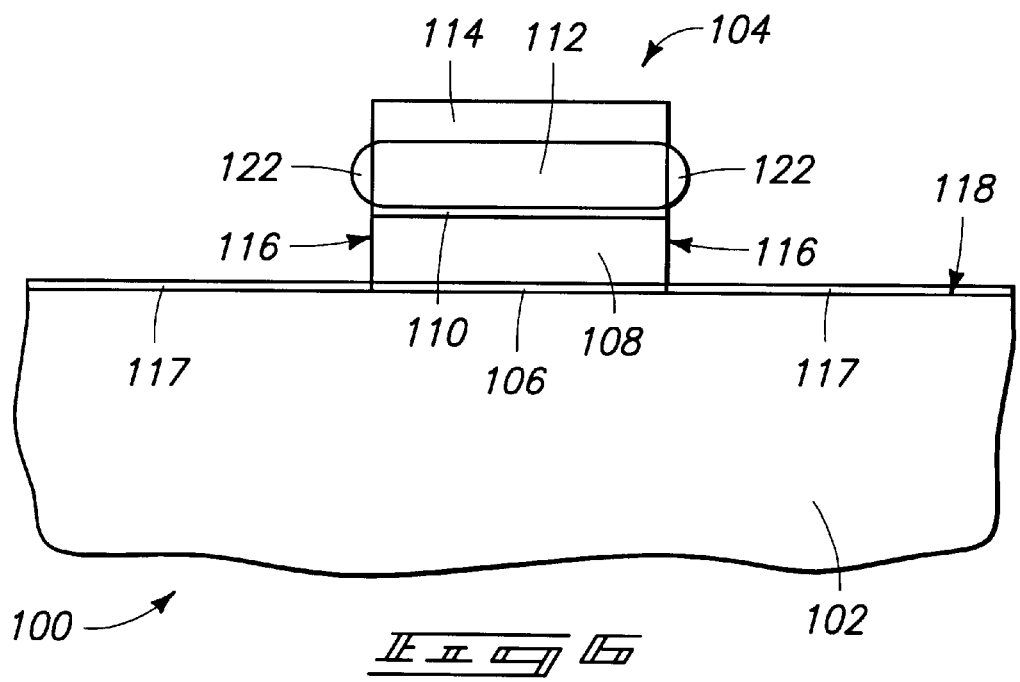
FIG. 6 is a view of the FIG. 4 wafer fragment illustrating the structure of FIG. 4 at a processing step subsequent to that shown in FIG. 5.

Referring to FIG. 6, layer 120 (FIG. 5) has been removed to leave silicide regions 122 along sidewalls 116. Removal of layer 120 can be accomplished by, for example, a timed etch, such as, for example, a timed reactive ion etch, wet etch, or high density plasma etch. Preferably, the etch will not appreciably etch into the sidewalls of silicon layer 108, (with the term "appreciable etching" meaning an etch of more than 5 angstroms into the sidewall), and also preferably the etch stops on etch stop layer 117 rather extending into upper surface 118 of substrate 102. Particular etching methodology can be utilized in embodiments in which silicon layer 120 (FIG. 5) comprises a different composition than silicon layer 108. In such embodiments, the etching preferably takes advantage of such differences in composition to selectively remove silicon of layer 120 relative to silicon of layer 108. For instance, if layer 120 comprises silicon which is less doped than the silicon of layer 108, such less doped silicon can be selectively removed utilizing a tetramethylammonium hydroxide (TMAH) etch solution.

Figure 1:
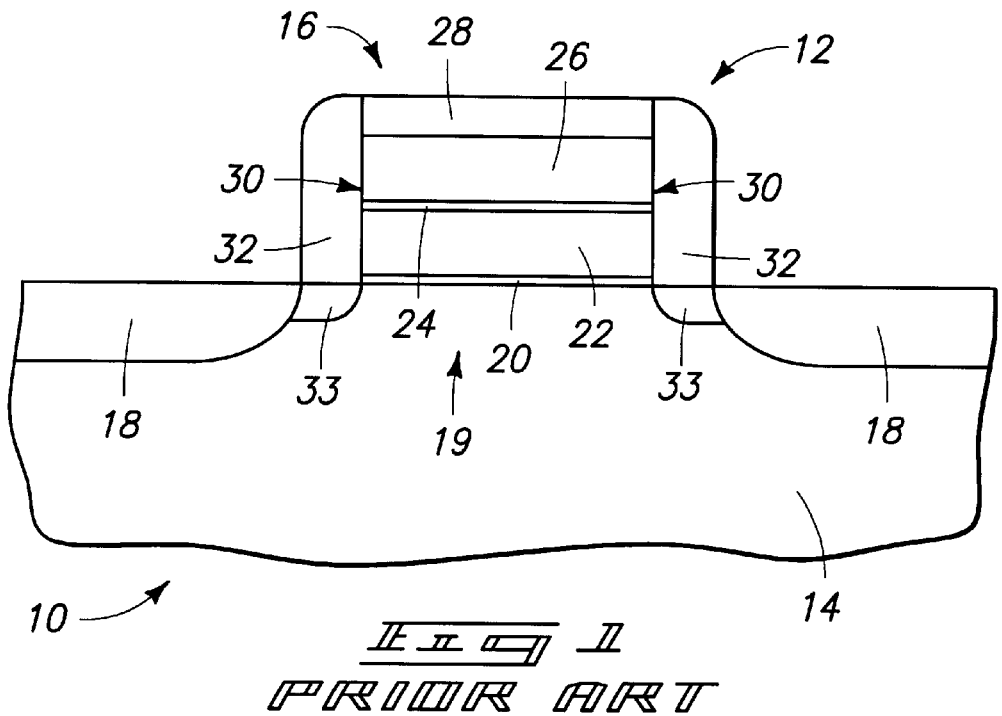
FIG. 1 is a fragmentary, diagrammatic, cross-sectional view of a semiconductor wafer fragment illustrating a prior art field effect transistor device.
Figure 2:
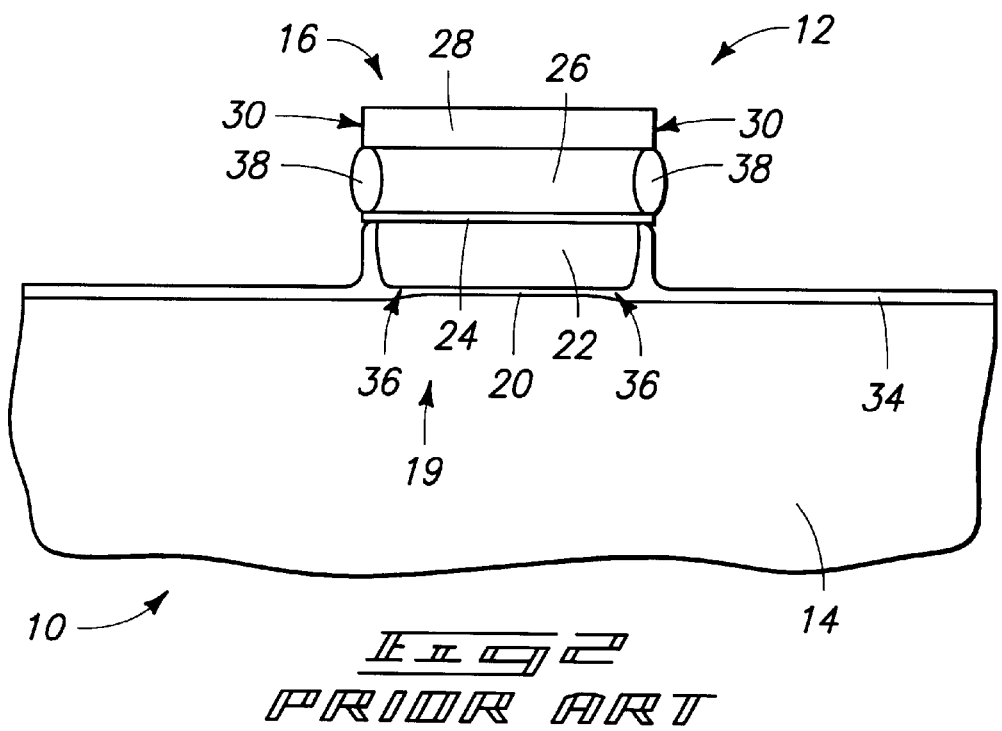
FIG. 2 is a fragmentary, diagrammatic, cross-sectional view of a semiconductor wafer fragment illustrating a prior art gate structure.

FIG. 7 shows fragment 100 after exposure to oxidizing conditions. It is noted that etch stop layer 117 can be stripped from over substrate 102 prior to the exposure of the substrate to oxidizing conditions, or can remain, and if it comprises silicon dioxide, be expanded upon exposure of the underlying substrate to oxidizing conditions. The oxidizing conditions incorporate silicon from upper surface 118 of substrate 102 into a layer 130 of silicon dioxide, and also incorporate silicon from sidewalls of layer 108 into silicon dioxide. Further, the oxidation has formed small bird's beaks 132 under sidewall edges 116 of gate stack 104. However, in contrast to the prior art (FIG. 2 illustrates the result of an exemplary prior art process) the oxidation has not oxidized sidewalls of metal layer 112. Rather, silicide regions 122 have protected the sidewalls of metal layer 112 during the oxidation.

Figure 9:
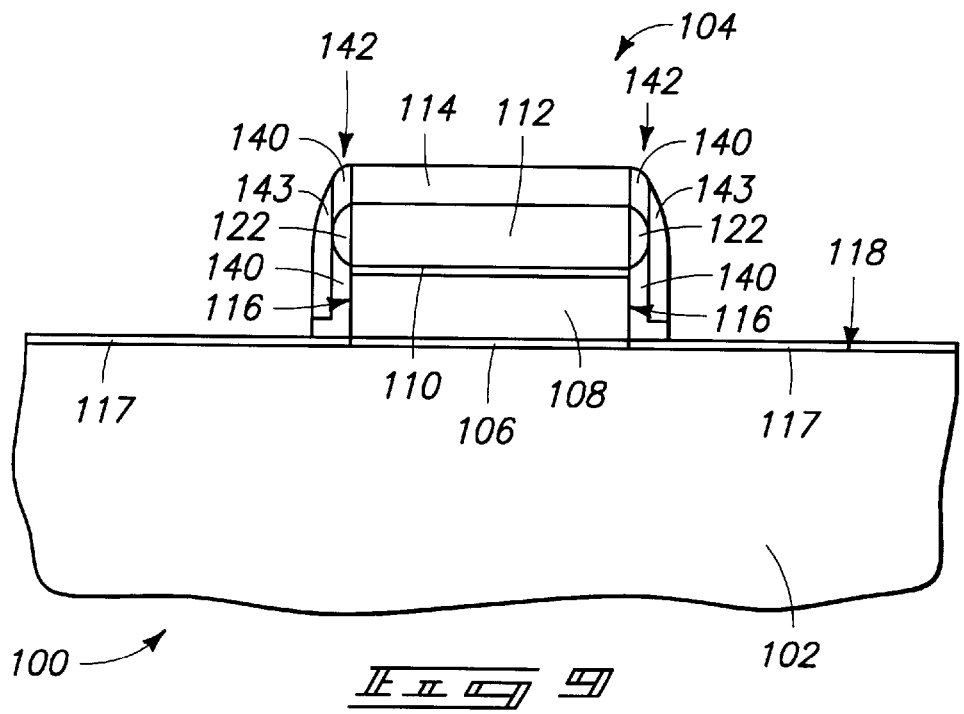
FIG. 9 is a view of the FIG. 4 wafer fragment shown at a processing step subsequent to that of FIG. 8.
Figure 10:
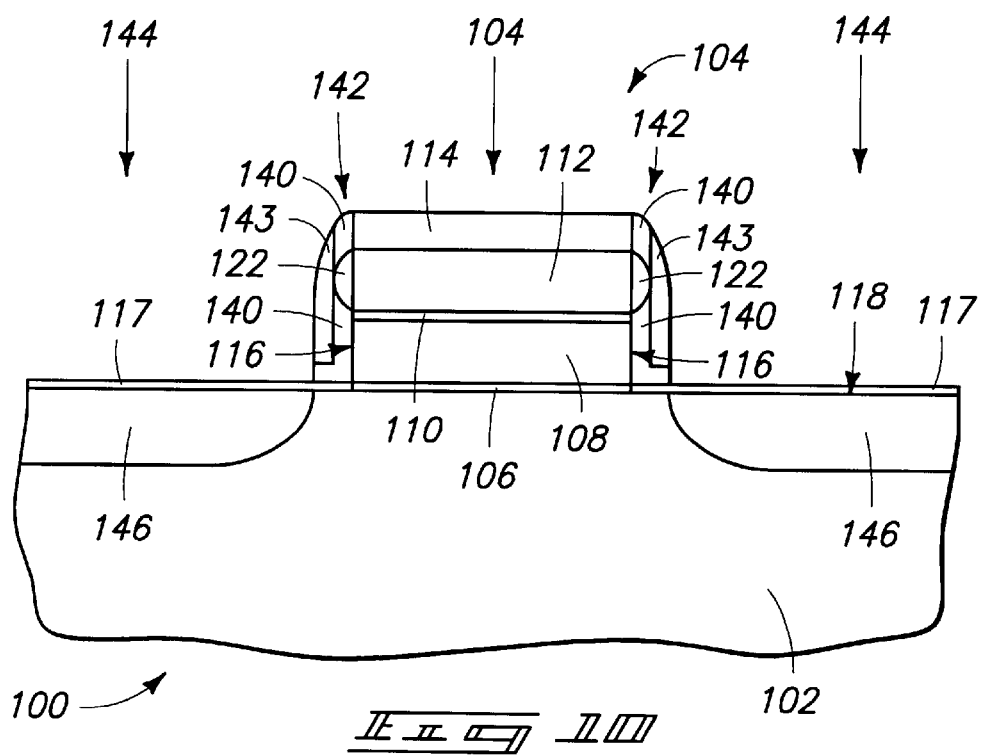
FIG. 10 is a view of the FIG. 4 wafer fragment shown at a processing step subsequent to that of FIG. 9.

FIGS. 8–10 illustrate an embodiment of the invention wherein the silicon of layer 120 (FIG. 5) is converted to a form which can be selectively removed relative to the silicon of layer 108. Referring initially to FIG. 8, such illustrates wafer fragment 100 at a processing step subsequent to that shown in FIG. 5. Specifically, silicon layer 120 of FIG. 5 has been subjected to oxidizing conditions to convert the layer to a silicon dioxide layer 140. Subsequent processing such as, for example, wet etching of oxide layer 140 in a diluted HF solution can selectively remove the oxide of layer 140 relative to non-oxidized silicon of layer 108 to form the structure of FIG. 6 (although some etching into sidewall edge 116 may occur).

FIG. 9 shows wafer fragment 100 after a second insulative layer 143 has been formed over silicon dioxide layer 140 (the second insulative layer can comprise, for example, silicon oxide or silicon nitride), and both silicon dioxide layer 140 and second insulative layer 143 have been exposed to an anisotropic etch to form insulative spacers 142. Exemplary conditions for anisotropically etching silicon dioxide are etching of the silicon dioxide in a magnetic loop discharge plasma, or utilization of a fluorine-containing plasma in a reactive ion etch. It is noted that layer 117 is shown remaining over substrate 102 after the anisotropic etch of materials 142 and 143. In embodiments in which layer 117 comprises silicon nitride and materials 142 and 143 both comprise silicon dioxide, layer 117 can function as an etch stop layer to protect substrate 102 during the anisotropic etch of layers 142 and 143. Alternatively, if layer 117 comprises silicon dioxide, and materials 142 and 143 also comprise silicon dioxide, layer 117 can form a buffer over substrate 102 to protect substrate 102 during a timed anisotropic etch of materials 142 and 143.

FIG. 10 shows a dopant 144 implanted into fragment 100 to form source/drain regions 146 proximate gate stack 104. Source/drain regions 146 are aligned utilizing spacers 142. In subsequent processing (not shown) spacers 142 can be removed, and substrate 102 can be oxidized to form small bird's beak structures analogous to the structures 132 of FIG. 7. Further, graded junction regions can be implanted proximate source/drain regions 146 subsequent to removal of spacers 142. Alternatively, graded junctions (such as LDD or "link-up" regions) can be implanted in a processing step prior to that shown in FIG. 4. Such processing a step can, for example, occur after formation of gate stack 104 and before deposition of silicon layer 120.

Figure 11:
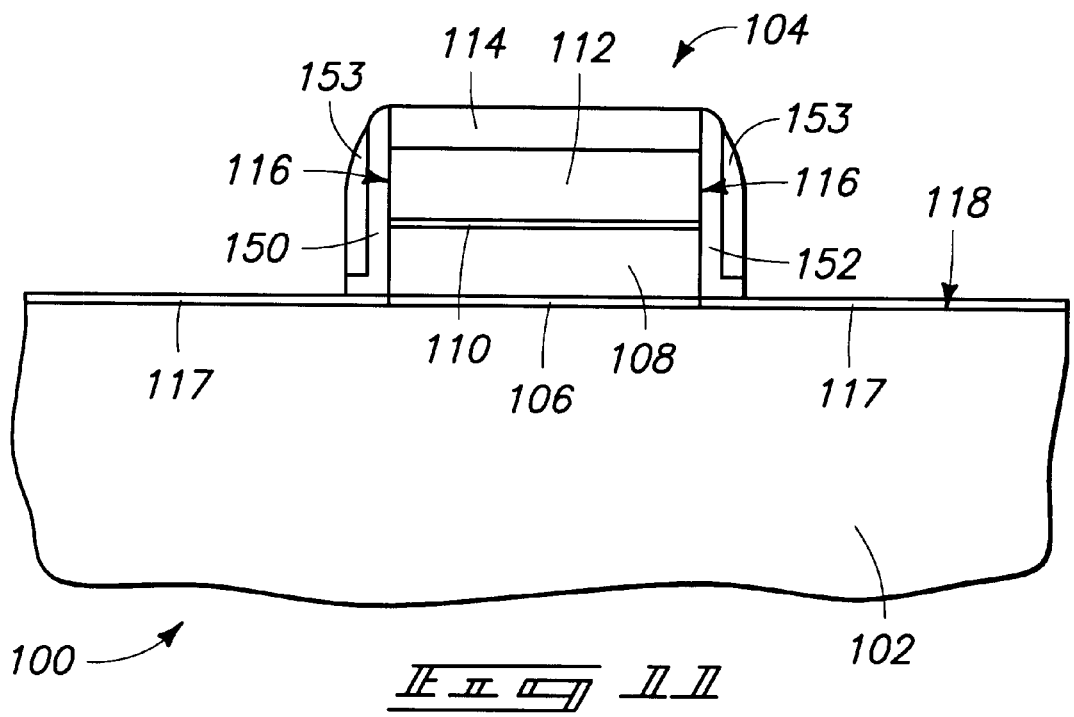
FIG. 11 is a view of the FIG. 4 wafer fragment shown at a processing step subsequent to that of FIG. 4, and in accordance with yet another embodiment method of the present invention.

Yet another method of the present invention is described with reference to FIGS. 11–13. Referring to FIG. 11, wafer fragment 100 is shown at a processing step subsequent to that of FIG. 4, and specifically is shown after a material 153 is provided over silicon layer 120 (FIG. 4), and both material 153 and silicon layer 120 have been subjected to anisotropic etching. Material 153 can comprise, for example, silicon dioxide or silicon nitride. The anisotropic etching removes the silicon layer from over stack 104 and leaves portions 150 and 152 of the silicon layer along sidewall edges 116.

Figure 12:
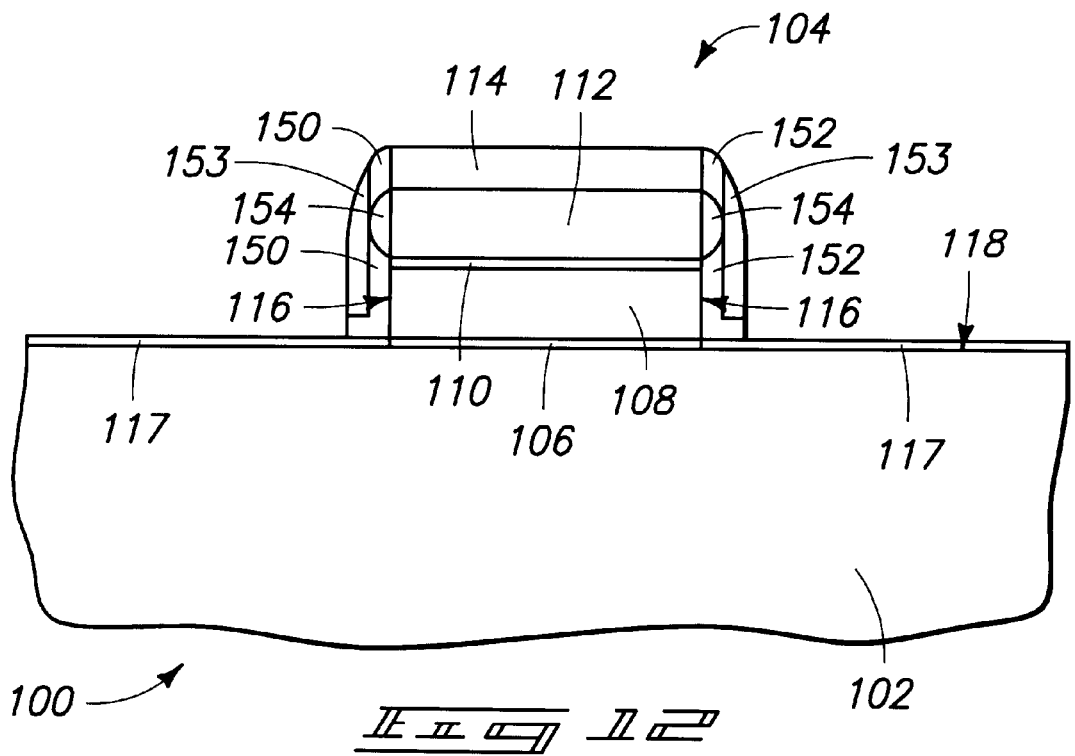
FIG. 12 is a view of the FIG. 4 wafer fragment shown at a processing step subsequent of that of FIG. 11.

Referring to FIG. 12, fragment 100 is shown after exposure to suitable conditions to react silicon of portions 150 and 152 with metal of layer 112 to form silicide regions 154. Such suitable conditions can comprise, for example, the conditions described above with reference to FIG. 5.

Referring to FIG. 13, anisotropically etched material 153 is utilized with portions 150 and 152 as spacers during an implant of a dopant 156. The implanted dopant forms source/drain regions 158. Also shown are graded junction regions 190 (such as, for example, LDD regions or halo regions), which can be formed by, for example, an angled implant. After formation of source/drain regions 158 and graded junction regions 190, stack 104 comprises a gate for a field effect transistor which gatedly connects source/drain regions 158 with one another. Stack 104 defines a channel region 160 thereunder which is between the source/drain regions 158. In further processing (not shown) portions 150 and 152 can be removed. Such further processing can be similar to that described above with reference to FIG. 6, and can occur before or after formation of diffusion regions 158.

In yet other aspects of the invention, the utilization of material 153 can be avoided, to leave only portions 150 and 152 along stack 104. Further, portions 150 and 152 can be removed prior to any implant of source/drain regions, to form a structure identical to that shown in FIG. 6. Such structure can be subjected to the oxidative processing described with reference to FIG. 7. Alternatively, such oxidative processing can occur after formation of source/drain regions 158, and either with portions 150 and 152 in place, or after portions 150 and 152 have been removed.

Another method encompassed by the present invention is described with reference to FIGS. 14–17. In referring to FIGS. 14–17, similar numbering will be used as was utilized in describing FIGS. 4–13, with differences indicated by the suffix "a".

FIG. 14 shows a semiconductor wafer fragment 100a which is similar to the fragment 100 of FIG. 4. Fragment 100a of FIG. 14 differs from fragment 100 of FIG. 4 in that fragment 100a comprises a silicon dioxide layer 106a having portions which extend outwardly beyond stack 104, as well as having a portion beneath stack 104. In contrast, fragment 100 of FIG. 4 has a silicon dioxide layer 106 which is patterned to have sidewalls coextensive with sidewalls of silicon layer 108, and accordingly, part of sidewalls 116 of gate stack 104.

Figure 15:
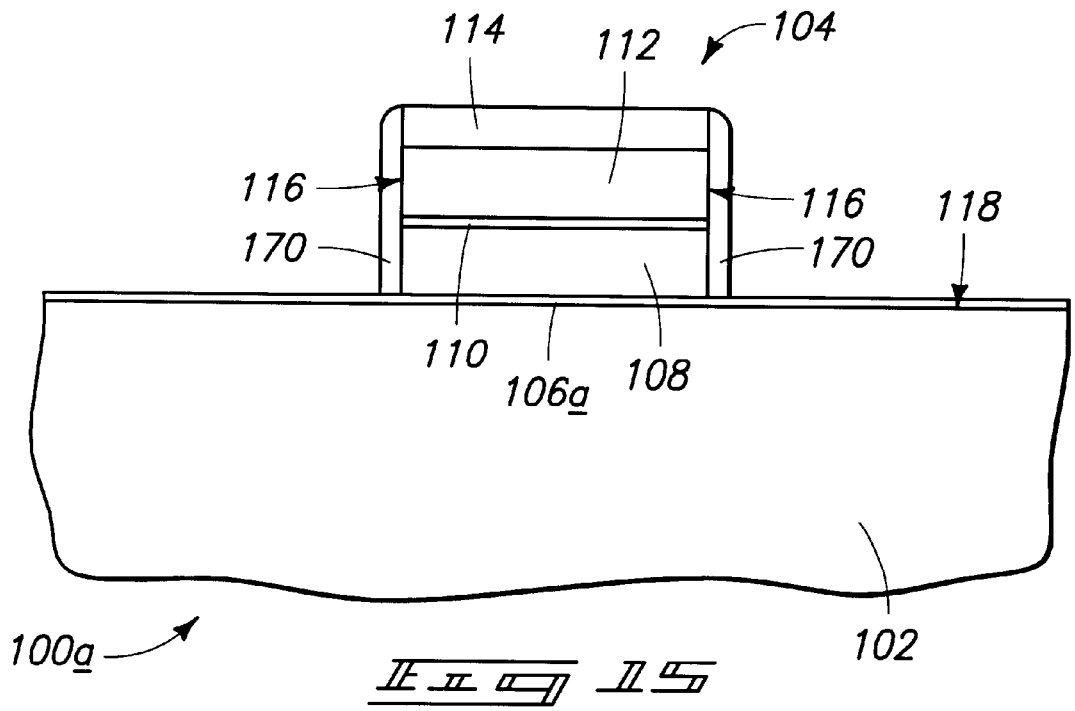
FIG. 15 is a view of the FIG. 14 wafer fragment shown at a processing step subsequent to that of FIG. 14.

Fragment 100a comprises a silicon layer 120 identical to that of FIG. 4 fragment 100, and such silicon layer can be processed identically to the processing described above with reference to FIGS. 5–13. A particular processing sequence is described with reference to FIGS. 15–17. Referring to FIG. 15, wafer fragment 100a is shown after silicon layer 120 (FIG. 14) has been subjected to an anisotropic etch to convert the layer to extensions 170 which extend along sidewall edges 116 of gate stack 104. The shown etch has stopped at oxide layer 106a. Such can be accomplished by timing an etch of layer 120 to stop at silicon dioxide layer 106a, or by utilizing etchant conditions which are selective for the silicon material of layer 120 relative to the silicon dioxide of layer 106a. In an alternative embodiment of the invention (not shown), etch conditions can be utilized which do not stop at layer 106a, but which rather extend through layer 106a to substrate 102. Such conditions pattern layer 106a into an insulative layer which is only beneath stack 104 and extensions 170 (i.e., which does not extend outwardly beyond extensions 170).

Figure 16:
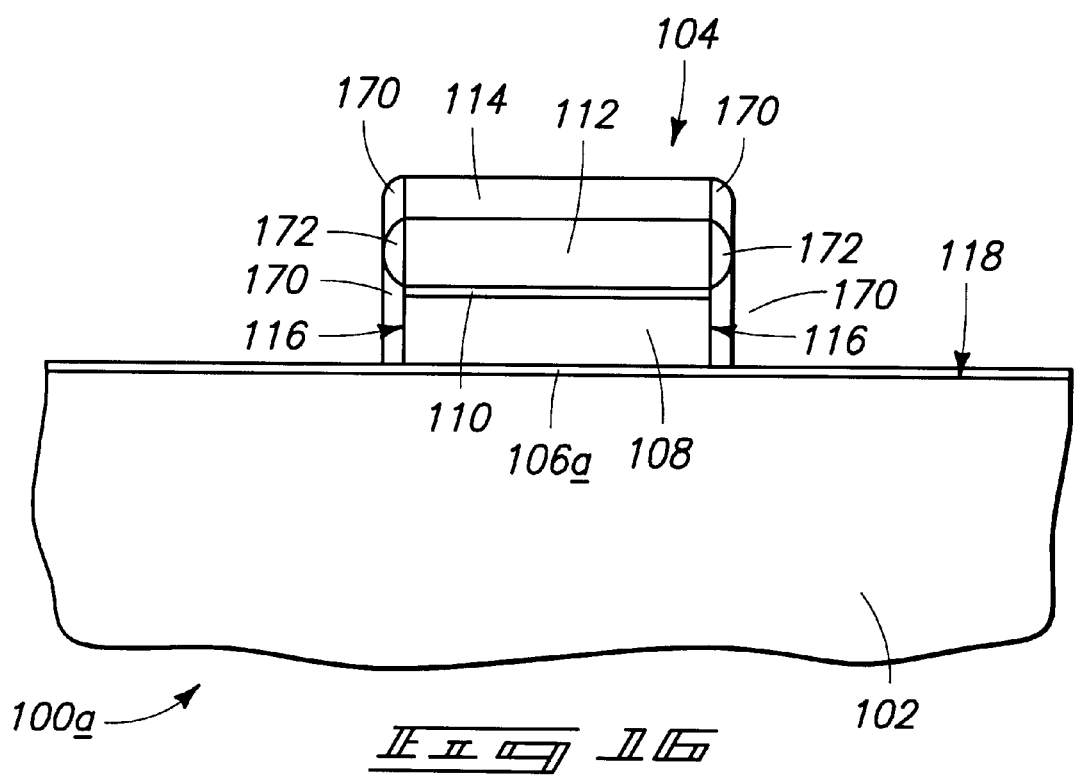
FIG. 16 is a view of the FIG. 14 wafer fragment shown at a processing step subsequent to that of FIG. 15.

Referring to FIG. 16, fragment 100a is subjected to conditions which react silicon from extensions 170 with metal from layer 112 to form silicide extensions 172. Suitable conditions for reacting the silicon and metal are the conditions described above with reference to FIG. 5.

Referring to FIG. 17, extensions 170 (FIG. 16) are removed to leave silicide regions 172 protecting sidewalls of metal 112. Portions of silicon dioxide layer 106a which were covered by extensions 170 in the processing step of FIG. 16 remain after extensions 170 are removed. After removal of extensions 170, fragment 100a can be subjected to oxidation conditions such as those described above with reference to FIG. 7. In alternative embodiments of the present invention, extensions 170 can be utilized as spacers during an implant of dopant to form source/drain regions in processing similar to that described above with reference to FIG. 13.

Figure 3:
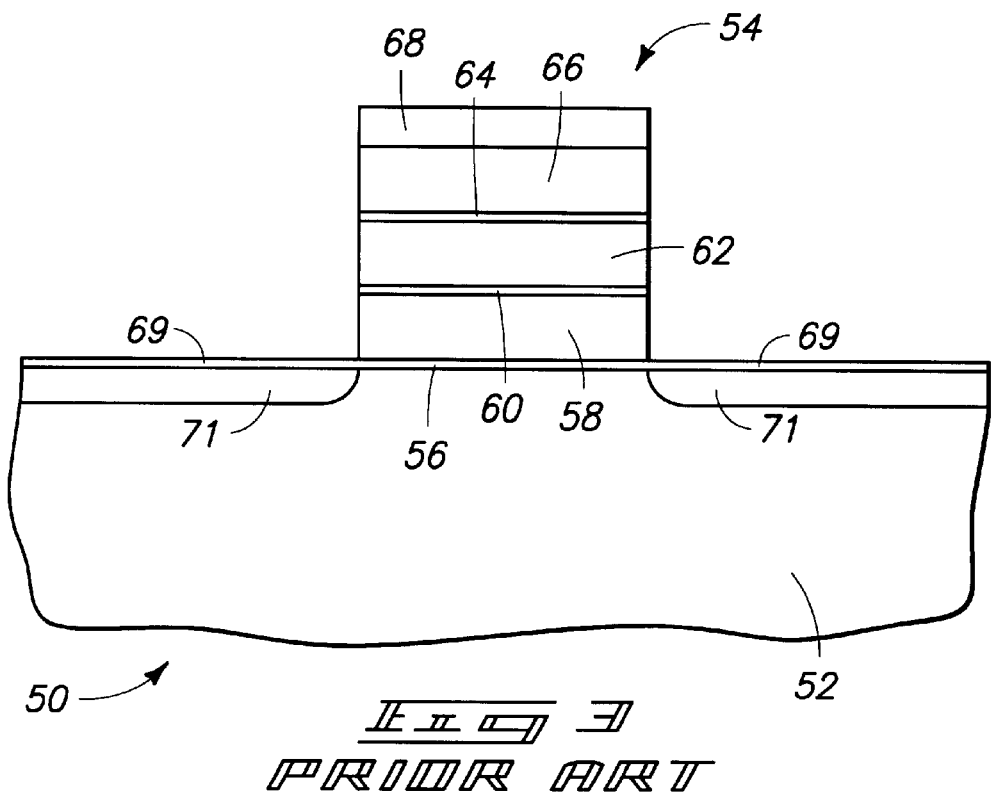
FIG. 3 is a diagrammatic, fragmentary, cross-sectional view of a semiconductor or wafer fragment illustrating a prior art gate structure for a flash memory device.

Although the invention has been described with reference to methods of forming field effect transistor structures, it is to be understood that the invention can also be applied to methods of forming other memory devices, such as, for example, flash memory devices. An exemplary method of utilizing the techniques described with reference to FIGS. 4–17 to form flash memory devices is to form the gate stacks described in FIGS. 4–17 over floating gate structures (with an exemplary floating gate structure shown in FIG. 3). The gate stacks will, of course, generally be separated from a floating gate by an intergate dielectric, such as, for example, the dielectric 60 described with reference to FIG. 3.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor structure, comprising:
   forming a stack which includes a semiconductive material layer and a metal-containing layer;
   forming silicide along a sidewall edge of the metal-containing layer; and
   after forming the silicide, oxidizing at least a portion of the semiconductive material layer.

2. A method of forming a semiconductor structure, comprising:
   forming a stack which includes a silicon-containing layer and a metal-containing layer;
   forming silicide along a sidewall edge of the metal-containing layer; and
   after forming the silicide, oxidizing at least a portion of the silicon-containing layer.

3. The method of claim 2 wherein the stack further comprises a metal nitride layer between the silicon-containing layer and the metal-containing layer.

4. The method of claim 3 wherein the metal nitride layer consists essentially of metal nitride.

5. The method of claim 2 wherein the metal-containing layer consists essentially of metal.

6. The method of claim 2 wherein the metal-containing layer comprises one or more of tungsten, titanium, cobalt and molybdenum.

7. The method of claim 2 wherein the silicon-containing layer comprises conductively-doped polysilicon.

8. The method of claim 2 wherein the silicon-containing layer consists essentially of conductively-doped silicon.

9. The method of claim 2 wherein the silicon-containing layer comprises silicon and germanium.

10. The method of claim 2 wherein the stack is in a shape of a line formed over a monocrystalline silicon substrate.

11. The method of claim 2 wherein the forming silicide comprises reacting the sidewall edge of the metal-containing layer with silicon.

12. The method of claim 2 wherein the stack is otherwise void of silicide except for the silicide formed at the sidewall edge of the metal-containing layer.

13. A method of forming a semiconductor structure, comprising:
   forming a patterned line comprising a first layer and a second layer over a monocrystalline silicon substrate, the first layer comprising silicon and the second layer comprising a metal, the line having at least one sidewall edge comprising a first-layer-defined portion and a second-layer-defined portion;
   forming a third layer along said at least one sidewall edge, the third layer comprising silicon and being along both the first-layer-defined portion of the sidewall edge and the second-layer-defined portion of the sidewall edge;
   reacting silicon of the third layer with metal of the second layer to form a silicide along the second-layer-defined portion of the sidewall edge; and
   removing the silicon of the third layer to leave the silicon of the first layer, the metal of the second layer and the silicide.

14. The method of claim 13 wherein the removing comprises a timed etch of the silicon of the third layer.

15. The method of claim 13 wherein the silicon of the third layer is selectively removable relative to the silicon of the first layer, and wherein the removing comprises selectively removing the silicon of the third layer relative to the silicon of the first layer.

16. The method of claim 15 wherein the silicon of the third layer is less doped than the silicon of the first layer.

17. The method of claim 13 wherein the removing comprises converting the silicon of the third layer to a form selectively removable relative to the silicon of the first layer, and subsequently selectively removing the silicon of the third layer relative to the silicon of the first layer.

18. A method of forming a semiconductor structure, comprising:
   forming a patterned line over a monocrystalline silicon substrate, the patterned line comprising a first silicon layer and a metal layer over the first silicon layer; the line having at least one sidewall edge comprising regions of the first-silicon layer and metal layer;
   forming a second silicon layer along said at least one sidewall edge, the second silicon layer being along the first silicon layer and metal layer regions of the sidewall edge;

reacting silicon of the second silicon layer with metal of the metal layer region to form a silicide along the metal layer region of the sidewall edge; and oxidizing the silicon of the second silicon layer to convert the second silicon layer to a silicon dioxide layer.

19. The method of claim 18 further comprising forming an insulative material over the metal layer before forming the second silicon layer along the sidewall edge.

20. The method of claim 18 further comprising selectively removing the silicon dioxide layer relative to the first silicon layer.

21. The method of claim 18 further comprising utilizing a portion of the silicon dioxide layer as a spacer during an implant of dopant to form source/drain regions proximate the patterned line.

22. The method of claim 18 wherein the metal layer comprises tungsten.

23. The method of claim 18 further comprising forming source/drain regions proximate at least a portion of the line and utilizing said portion of the line as a gate of a field effect transistor.

24. The method of claim 18 further comprising forming at least a portion of the line over a floating gate.

* * * * *

UNITED STATES PATENT AND TRADEMARK OFFICE
CERTIFICATE OF CORRECTION

PATENT NO. : 6,541,362 B2
DATED : April 1, 2003
INVENTOR(S) : Leonard Forbes et al.

It is certified that error appears in the above-identified patent and that said Letters Patent is hereby corrected as shown below:

<u>Column 3,</u>
Line 24, please replace "be formed by, for is example, implanting n-type conductivity" with -- be formed by, for example, implanting n-type conductivity --

<u>Column 4,</u>
Line 49, please replace "the structure of FIG. 4 at a processing step subsequent of that" with -- the structure of FIG. 4 at a processing step subsequent to that --

<u>Column 8,</u>
Line 1, please replace "prior to that shown in FIG. 4. Such processing a step can, for" with -- prior to that shown in FIG. 4. Such processing step can, for --

<u>Column 10,</u>
Line 63, please replace "regions of the first-silicon layer and metal layer" with -- regions of the first silicon layer and metal layer --

Signed and Sealed this

Sixteenth Day of March, 2004

JON W. DUDAS
*Acting Director of the United States Patent and Trademark Office*